США011216042B2

(12) United States Patent
Kanas et al.

(10) Patent No.: US 11,216,042 B2
(45) Date of Patent: Jan. 4, 2022

(54) COMPUTING DEVICES WITH A KICKSTAND

(71) Applicant: HEWLETT-PACKARD DEVELOPMENT COMPANY, L.P., Houston, TX (US)

(72) Inventors: Derek Kanas, Houston, TX (US); Chan Park, Houston, TX (US); Tony Moon, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 728 days.

(21) Appl. No.: 16/076,225

(22) PCT Filed: Jun. 6, 2017

(86) PCT No.: PCT/US2017/036037
§ 371 (c)(1),
(2) Date: Aug. 7, 2018

(87) PCT Pub. No.: WO2018/226209
PCT Pub. Date: Dec. 13, 2018

(65) Prior Publication Data
US 2021/0181793 A1   Jun. 17, 2021

(51) Int. Cl.
*G06F 1/16* (2006.01)
*H05K 5/02* (2006.01)

(52) U.S. Cl.
CPC ............ *G06F 1/166* (2013.01); *G06F 1/1618* (2013.01); *H05K 5/0234* (2013.01)

(58) Field of Classification Search
CPC ........ G06F 1/1618; G06F 1/162; G06F 1/166; G06F 1/1681; G06F 1/1679; G06F 1/1616; H05K 5/0234; H01F 7/02
See application file for complete search history.

(56) References Cited

U.S. PATENT DOCUMENTS 9,116,550 B2   8/2015   Siddiqui et al.
9,161,469 B2   10/2015   Han
(Continued)

FOREIGN PATENT DOCUMENTS

EP        2784624 A2     10/2014
WO    2016048356 A1      3/2016

OTHER PUBLICATIONS

"Inspiron 11 3000 2in1", Retrieved from Internet: http://www.dell.com/in/p/inspiron-11-3158-laptop/pd?ST=hybrid%20dell%20notebook&dgc=ST&cid=288121&lid=5518617&acd=1059922293323414114&ven1=sCsAm5hX2&ven2=b, 2016, 7 Pages.

*Primary Examiner* — James Wu
(74) *Attorney, Agent, or Firm* — HP Inc. Patent Department

(57) ABSTRACT

Examples disclosed herein provide a computing device. One example computing device includes a first member including a first surface and a second surface opposite the first surface, and a second member including a third surface and a fourth surface opposite the third surface, wherein the second member is rotatably connected to the first member. The computing device includes a kickstand rotatably connected to the fourth surface of the second member at a first end of the kickstand. The computing device includes magnetic members to magnetically couple the second surface of the first member with a second end of the kickstand opposite the first end of the kickstand. As an example, when the computing device is to change from a first operation mode to a second operation mode, the kickstand is to move along the second surface of the first member via the magnetic coupling.

13 Claims, 4 Drawing Sheets

(56) References Cited

U.S. PATENT DOCUMENTS

| | | |
|---|---|---|
| 9,249,922 B2 * | 2/2016 | Haarburger ............ A47B 23/04 |
| 9,304,553 B2 | 4/2016 | Park et al. |
| 9,430,000 B2 | 8/2016 | Hood, III et al. |
| 9,921,610 B2 * | 3/2018 | Lu ............................ G06F 1/166 |
| 2011/0128216 A1 | 6/2011 | Renwick |
| 2012/0068798 A1 | 3/2012 | Lauder et al. |
| 2013/0031289 A1 * | 1/2013 | Yeh ....................... G06F 1/1632 |
| | | 710/303 |
| 2013/0277271 A1 | 10/2013 | Toulotte |
| 2013/0286623 A1 | 10/2013 | Slipy et al. |
| 2014/0254077 A1 | 9/2014 | Griffin |
| 2017/0090522 A1 | 3/2017 | Lu et al. |

* cited by examiner

COMPUTING DEVICES WITH A KICKSTAND

BACKGROUND

The emergence and popularity of mobile computing has made portable computing devices, due to their compact design and light weight, a staple in today's marketplace. Within the mobile computing realm, notebook computers, or laptops, are one of the most widely used devices and generally employ a clamshell-type design consisting of two members connected together at a common end via hinges, for example. In most cases, a first or display member is utilized to provide a viewable display to a user while a second or base member includes an area for user input (e.g., touchpad and keyboard). In addition, the viewable display may be a touchscreen (e.g., touchscreen laptop), allowing the user to interact directly with what is displayed by touching the screen with simple or multi-touch gestures.

DETAILED DESCRIPTION

Notebook computers ay include a feature that allows the device to be "converted" from one style of use to at least another style of use. For example, a notebook computer may be converted from a laptop operation mode, where the touchpad and keyboard are used as input components, to a tablet operation mode, where the viewable display is used for both viewing and input. Such devices that serve this dual purpose may be called convertible laptops. Many form factors exist for convertible laptops. As an example of a convertible laptop, the hinges coupling the base and display members may allow the display member to flip 360 degrees when transitioning from laptop mode to tablet mode. As a result of flipping over the display member by 360 degrees, the display member and base member may be collapsed against each other in an open, folded position. As an example, in this open, folded position, a bottom surface of the base member may be covered by a back surface of the display member.

Examples disclosed herein provide a mechanism for computing devices, such as the notebook computer described above with the 360 degree hinge, which allows the computing device to be operable in another mode known as inking operation mode. As the name implies, inking operation mode, for example, for the notebook computer with the 360 degree hinge, allows a user to interact with a display surface of the device (e.g., touchscreen) via a finger or stylus, such as a digital pen. Rather, than having the touchscreen lay flat, as it does in tablet operation mode, it is preferable for the display surface to be viewed at an angle. Interacting with the display surface at an angle while operating in inking operation mode may contribute towards physical ergonomics. As an example, the mechanism may allow the computing device to feel sturdy and rigid while being used in inking operation mode. For example, when the user interacts with the display surface with a digital pen, it is not desirable for the display member to collapse and fall backwards towards the base member.

Figure 1A:
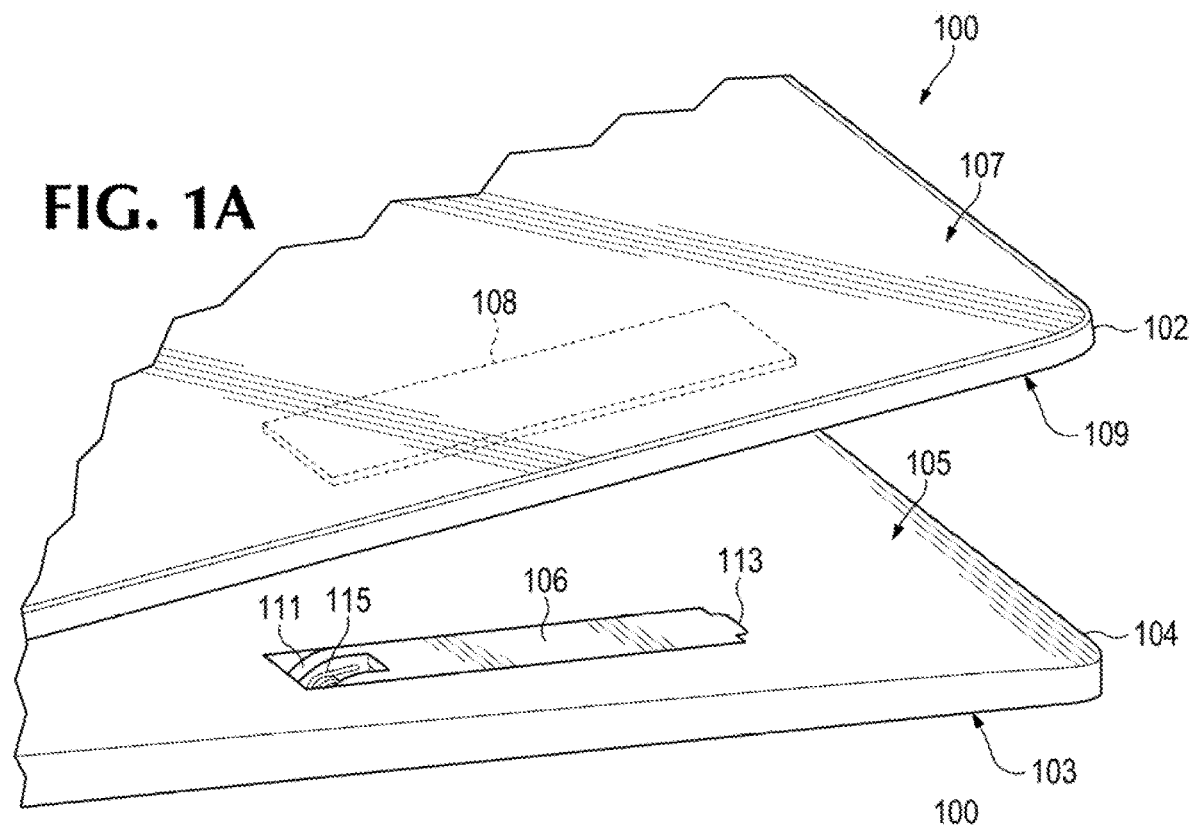
FIGS. 1A-C illustrate a computing device including a kickstand that allows for the computing device to be operable in and inking operation mode, according to an example.
Figure 1B:
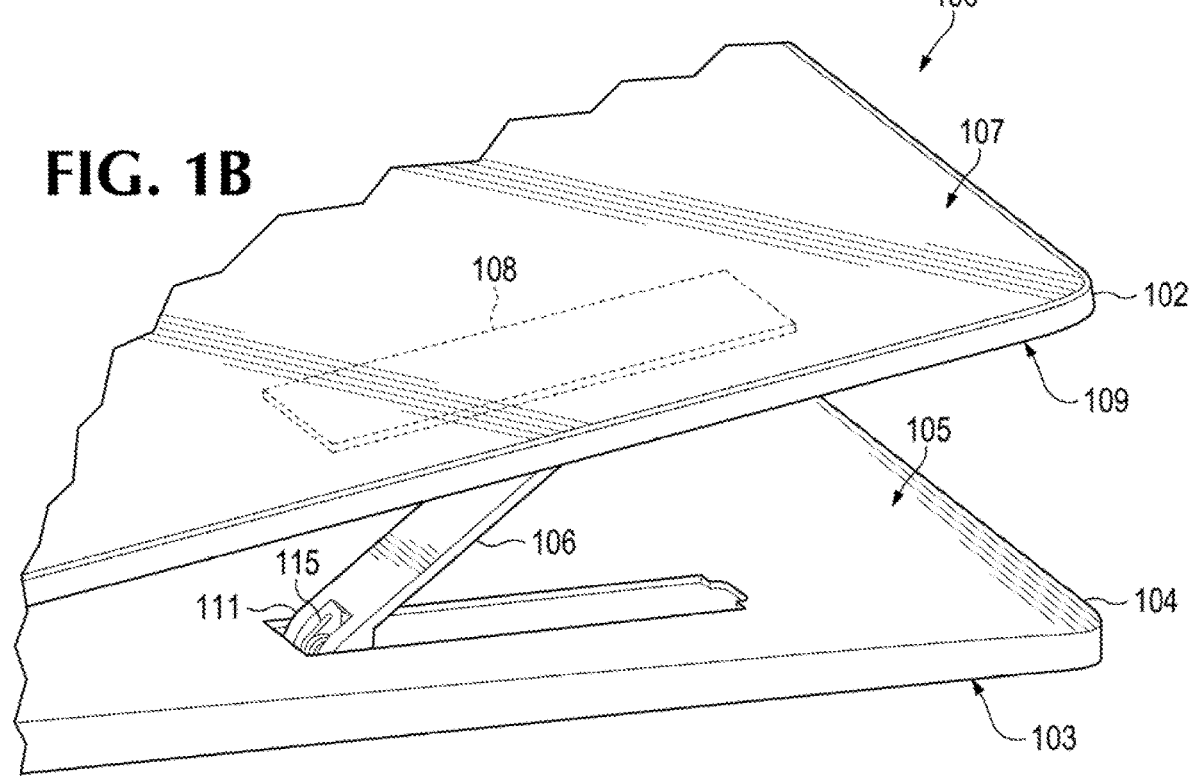
Figure 1C:
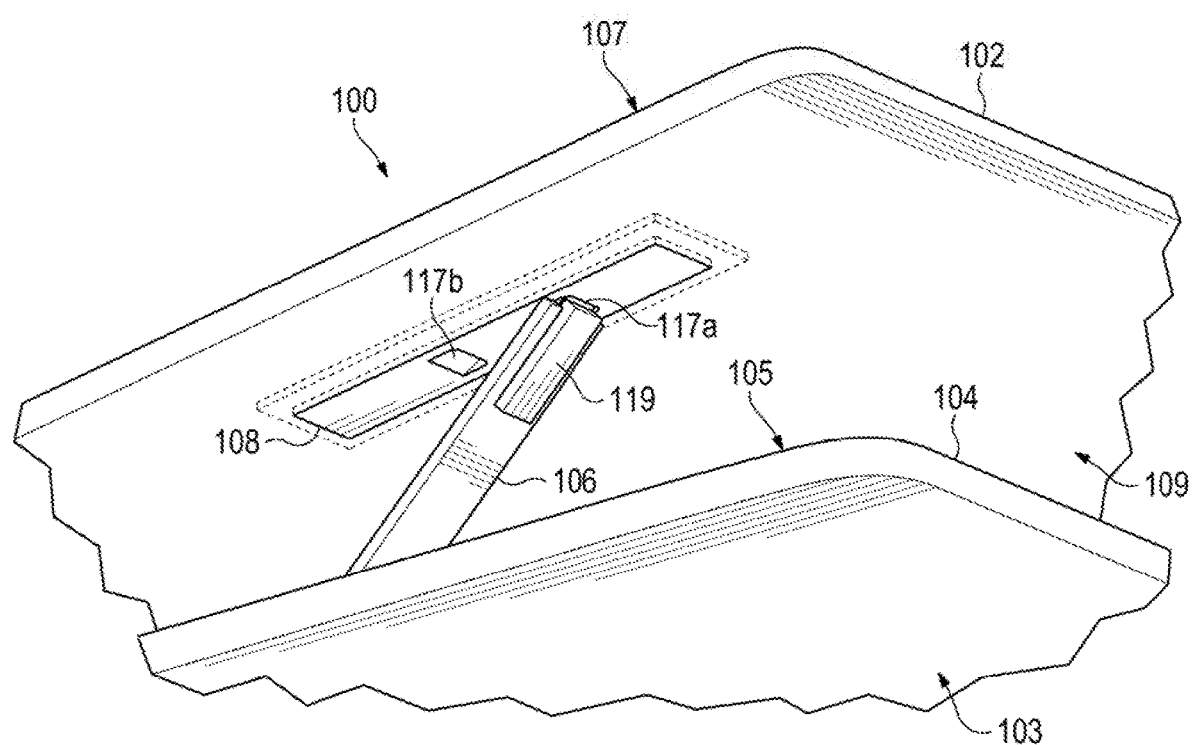

With reference to the figures, FIG. 1A-C illustrate a computing device 100 including a kickstand 106 that allows for the computing device 100 to be operable in the inking operation mode, as an example. The device 100 includes a first member (base member 104) and a second member (display member 102) that are rotatably connected to each other. As described above, the hinges coupling the base member 104 and display member 102 to each other may allow for display member 102 to flip 380 degrees when transitioning from laptop mode to tablet mode. The base member 104 includes a top surface 103 that may include input means for operation by a user, such as a keyboard and/or a touchpad, and a bottom surface 106 opposite the top surface 103. The display member 102 includes a display surface 107 and a back surface 109 opposite the display surface 107. As an example, the display surface 107 may be used for viewing the video output of the laptop 100, and include input means for operation by a user, such as a touchscreen.

Referring to FIG. 1A, as the computing device 100 is being transitioned to a first operation mode (tablet mode), the display member 102 and base member 104 end up being in a parallel orientation and collapsed against each other in an open, folded position. As an example, in this open, folded position, the bottom surface 105 of the base member 104 may be covered by the back surface 109 of the display member 102, as illustrated. As an example, the computing device 100 includes a kickstand 106 for providing stability while operating the device 100 in a second operation mode (inking operation mode). Although the kickstand 106 is illustrated as being rotatably connected to the bottom surface 105 of the base member 104 at a first end 111, the kickstand 106 may be connected to other surfaces of the computing device 100, such as the back surface 109 of the display member 102. As a result, although the kickstand 106 may be described as being biased toward or away from the bottom surface 105 of the base member 104, the kickstand 106 may be connected to other surfaces of the computing device 100. In addition, although a single kickstand is illustrated, multiple kickstands may be utilized, with varying widths. For example, a kickstand may be found on either end of the surface of the computing device 100 where they are disposed. As an example, a single and larger kickstand may be disposed along the middle of a surface of the computing device 100.

As will be further described, computing device 100 may include a mechanism for utilizing the kickstand 106 when the computing device 100 is being transitioned to inking operation mode. In addition, the mechanism may stow away the kickstand 106 as the computing device 100 is transitioned out of inking operation mode, and to a third operation mode, such as laptop mode. By retracting the kickstand 106 when the computing device 100 is no longer being used in inking operation mode, the kickstand 106 may be stowed away to avoid any damage, as illustrated in FIG. 1A. As an example, the kickstand 106 may be spring loaded by including springs 115 to bias the kickstand 106 towards the bottom surface 105. The springs 115 may enable automatic rotation of the kickstand 106 towards the bottom surface 105 when the computing device 100 is not in inking operation mode, or being transitioned from inking operation mode to another operation mode, as will be further described. The springs 115 may be, for example, a compression spring, a torsion spring, etc. The computing device 100 may include multiple springs or a single spring for stowing away the kickstand 106. Referring FIG. 1A, prior to the back surface 109 of the display member 102 making contact with the bottom surface 105 of the base member 104, or while the computing device 100 is being using in an operation mode besides inking operation mode, the springs 115 may keep the kickstand 106 stowed away, in order to avoid any damage to the kickstand 106.

For utilizing the kickstand 106 when the computing device 100 is being transitioned to inking operation mode, the computing device 100 may include magnetic members for magnetically coupling a second end 113 of the kickstand 106 with the back surface 109 of the display member 102. Referring to FIG. 1B, the magnetic coupling may overcome the bias provided by the spring 115, biasing the kickstand 106 away from the bottom surface 105 of the base member 104, as will be further described. As a result, the kickstand 106 may move along the back surface 109 of the display member 102 via the magnetic coupling, as illustrated. As an example, the kickstand 106 may include ferrous materials and/or magnetic members 119 to magnetically couple the second end 113 of the kickstand 106 with the back surface 109 of the display member 102, as illustrated in FIG. 1C. In order to extend the kickstand 106 from its retracted position, the force provided by the magnetic coupling may be greater than the spring loading provided by the springs 115. For example, when the computing device 100 is changed from a first operation mode (e.g., tablet mode) to a second operation mode (e.g., inking mode), the magnetic coupling between the back surface 109 of the display member 102 and the second end 113 of the kickstand 106 may overcome the bias provided by the spring 115. As a result, the magnetic coupling may bias the kickstand 106 away from the back surface 105 and cause the kickstand 106 to move along the back surface 109 as the device is transitioned to inking mode. The placement of the magnetic members 119 within the kickstand 106 may vary. As an example, the kickstand 106 itself may be a magnetic member.

Friction between the kickstand 106 and the back surface 109 of the display member 102 may provide the support for operating the computing device 100 in inking operation mode. As an example, in order to provide support independent of friction, the back surface 109 may include detent grooves 117*a-b* to create and support the magnetic coupling between the back surface 109 and the second end 113 of the kickstand 106, as illustrated in FIG. 1C. As an example, the detent grooves 117*a-b* may be disposed on a steel plate for magnetically coupling with the magnetic members 119 of the kickstand 106. As illustrated in the figures, the back surface 109 may include multiple detent grooves in order to provide a choice of viewing angles while the computing device 100 is in inking operation mode. For example, as the computing device 100 is transitioned to inking operation mode, where the display member 102 is lifted from the base member 104, the kickstand 106 may move from one detent groove (e.g., 117*a*) to another detent groove (e.g., 117*b*) until the display surface 107 is at a desirable viewing angle. As the kickstand 106 moves from one detent groove to another detent groove, the angle of the display member 102 with respect to the base member 104 changes. In addition, as the force provided by the magnetic coupling may be greater than the spring loading provided by the spring 115, the kickstand 106 may be biased further away from the base member 104 as the viewing angle is increased in inking mode. Although two detent grooves are illustrated, the number of detent grooves may vary.

As an example, the back surface 109 of the display member 102 may have a corresponding ferrous and/or magnetic material 108 for magnetically coupling with the magnetic members 119 of the kickstand 106. The magnetic members 119 of the kickstand 106 may be arranged to produce magnetic fields that cooperate with the ferrous and/or magnetic material 108 on the back surface 109, to generate a magnetic attractive force that attaches the second end 113 of the kickstand 106 and the back surface 109 together in a mating engagement. As mentioned above, the detent grooves 117*a-b* may be disposed on a steel plate, which magnetically couples with magnetic members 119 of the kickstand 106. Properties of the magnetic members that may be controlled include, but are not limited to, field strength and magnetic polarity. The arrangement of the ferrous and/or magnetic material 108 may vary.

During the transition from inking mode to a third operation mode, such as laptop mode, there may be a moment where the spring loading provided by the springs 115 may overcome the force provided by the magnetic coupling between the kickstand 106 and back surface 109 of the display member 102. For example, upon the kickstand 106 magnetically coupling to the last detent groove 117*b*, if the display member 102 is raised any further by increasing the viewing angle, the force provided by the magnetic coupling may drop off steeply and be overcome by the spring loading provided by the springs 115. As a result, the springs 115 may bias the kickstand 106 by automatically rotating the kickstand 106 back towards the bottom surface 105 of the base member 104. As an example, the magnetic members 119 disposed within the kickstand 106 may include alternating-pole magnets that provide a force profile that drops off steeply with distance, so that upon reaching the last detent groove 117*b*, the force provided by the magnetic coupling may be overcome by the spring loading provided by the springs 115.

Figure 2A:
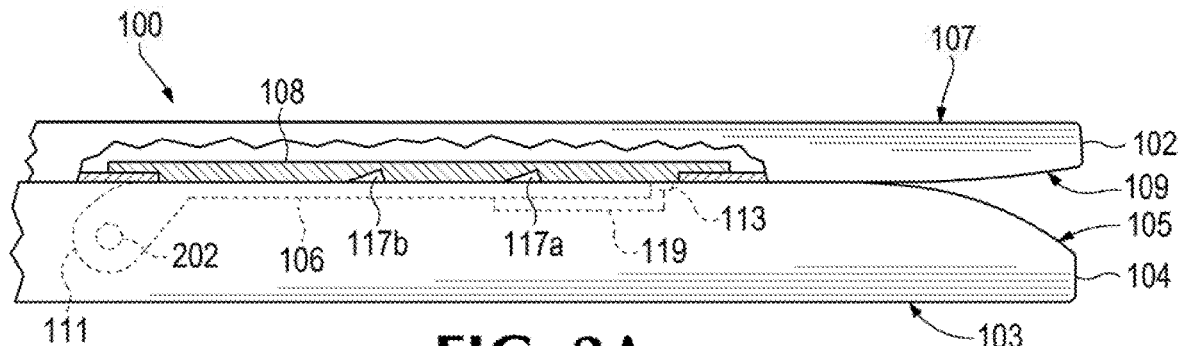
FIGS. 2A-C illustrate a side profile of the computing device as it is transitioned to the inking operation mode, according to an example.
Figure 2B:
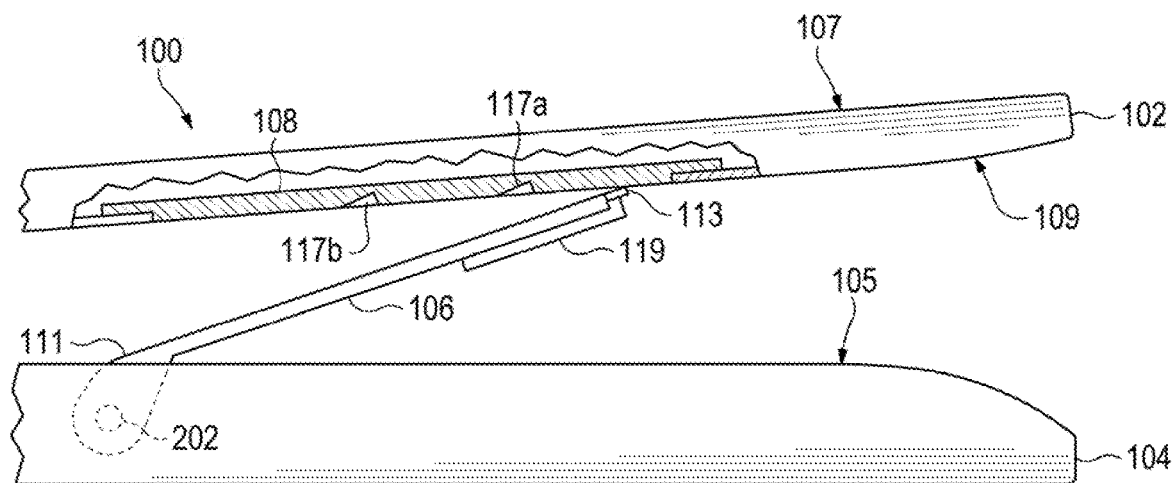
Figure 2C:
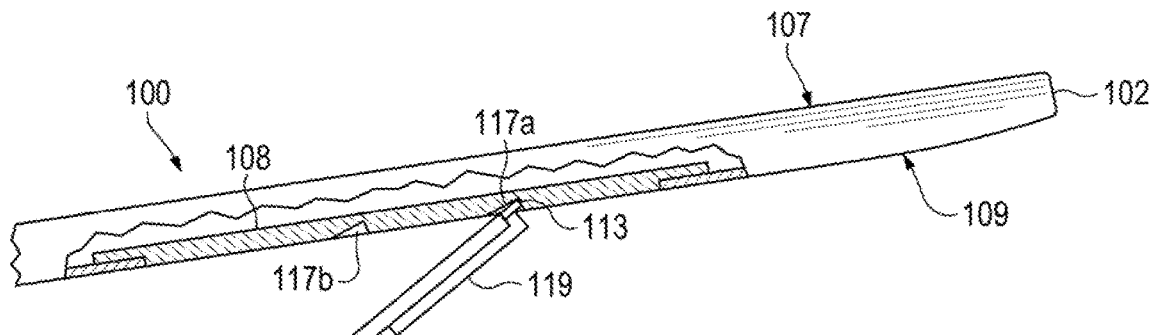
Figure 2C:
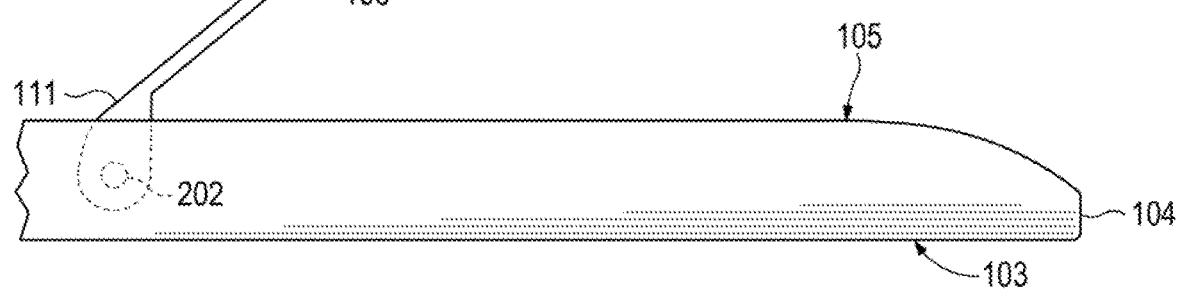

FIGS. 2A-C illustrate a side profile of the computing device 100 as it is transitioned from a first operation mode (tablet mode illustrated in FIG. 2A) to a second operation mode (inking mode illustrated in FIG. 2B), according to an example. As illustrated, the kickstand 106 may be rotatably connected within the base member 104 around an axis 202. Referring to FIG. 2A, while the computing device 100 is in tablet mode, the bottom surface 105 of the base member 104 may accommodate the kickstand 104, in order for the display member 102 to be flush against the base member 104. Referring now to FIG. 2B, as the computing device 100 is transitioned to inking mode (i.e., prior to the second end 113 of the kickstand 106 making contact with a detent groove 117*a-b*), the magnetic members described above (e.g., a combination of the magnetic member 119 and ferrous and/or magnetic material 108) may magnetically couple the second end 113 of the kickstand 106 with the back surface 109 of the display member 102. The magnetic coupling may overcome the bias provided by the spring 115, biasing the kickstand 106 away from the bottom surface 105 of the base member 104. As a result, the kickstand 106 may move along the back surface 109 of the display member 102 via the magnetic coupling, as illustrated. Finally, referring to FIG. 1C, upon the second end 113 of the kickstand 106 making contact with the detent groove 117*a*, the computing device 100 may feel sturdy and rigid while being used in inking operation mode. For example, when the user interacts with the display surface 107 with a digital pen, the display member 102 is less likely to collapse and fall backwards towards the base member 104.

Figure 3:
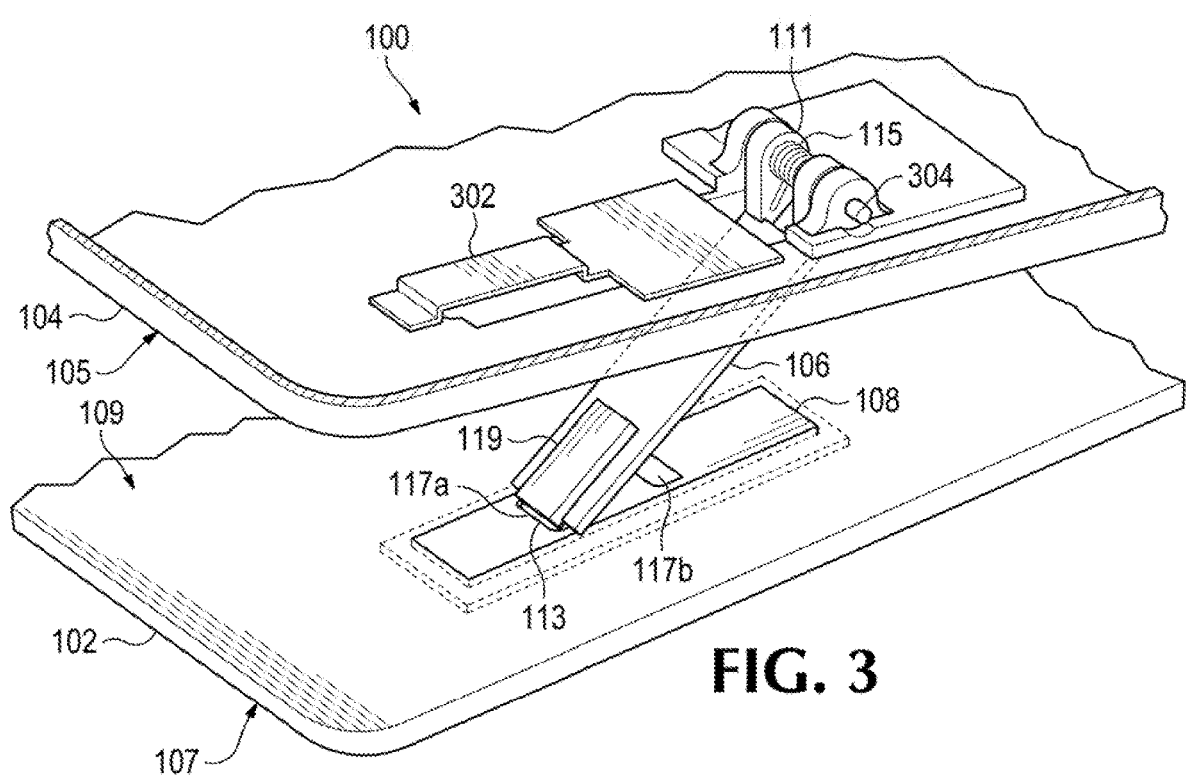
FIG. 3 illustrates a view of the mechanism for accommodating the kickstand within a member of the computing device, according to an example.

FIG. 3 illustrates a view of the mechanism for accommodating the kickstand 106 within the base member 104, according to an example. The kickstand 106 may be rotatably connected within the base member 104 around an axis 304. As illustrated, spring 115 may bias the kickstand 106 toward the bottom surface 105 of the base member, around axis 304. Also disposed within the base member, a part 302 may be included to prevent the kickstand 106 from rotating into the base member 104 beyond a certain point. The part 302 may be shaped to accommodate the kickstand 106, in order for the display member 102 to be flush against the base member 104 while in tablet mode (e.g., see FIG. 2A).

It should be understood that examples described herein below may include various components and features. It should also be understood that, in the following description, numerous specific details are set forth to provide a thorough understanding of the examples. However, it should be understood that the examples may be practiced without limitations to these specific details. In some instances, well known methods and structures may not be described in detail to avoid unnecessarily obscuring the description of the examples. Also, the examples may be used in combination with each other.

Reference in the specification to "an example" or similar language means that a particular feature, structure, or characteristic described in connection with the example is included in at least one example, but not necessarily in other examples. The various instances of the phrase "in one example" or similar phrases in various places in the specification are not necessarily all referring to the same example.

It should be understood that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A computing device comprising:
   a base member including a top surface and a bottom surface opposite the top surface;
   a display member including a display surface and a back surface opposite the display surface, wherein the display member is rotatably connected to the base member;
   a kickstand rotatably connected to the bottom surface of the base member at a first end of the kickstand;
   a spring to bias the kickstand toward the bottom surface of the base member; and
   magnetic members to magnetically couple the back surface of the display member with a second end of the kickstand opposite the first end of the kickstand, wherein, when the computing device is to change from a first operation mode to a second operation mode, the kickstand is to move along the back surface of the display member via the magnetic coupling.

2. The computing device of claim 1, wherein when the computing device is to change from the first operation mode to the second operation mode, the magnetic coupling between the back surface of the display member and the second end of the kickstand is to overcome the bias provided by the spring, wherein the magnetic coupling is to bias the kickstand away from the bottom surface of the base member.

3. The computing device of claim 2, wherein when the computing device is to change from the second operation mode to a third operation mode, the spring is to overcome the magnetic coupling between the back surface of the display member and the second end of the kickstand, wherein the spring is to bias the kickstand back toward the bottom surface of the base member.

4. The computing device of claim 1, wherein the back surface of the display member comprises detent grooves to support the magnetic coupling between the back surface of the display member and the second end of the kickstand.

5. The computing device of claim 4, wherein the detent grooves are to provide multiple viewing angles for the display member when the computing device is in the second operation mode.

6. A computing device comprising:
   a base member including a first surface and a second surface opposite the first surface;
   a display member including a third surface and a fourth surface opposite the third surface, wherein the display member is rotatably connected to the base member;
   a kickstand rotatably connected to the second surface of the base member at a first end of the kickstand;
   a spring to bias the kickstand toward the second surface of the base member; and
   magnetic members to magnetically couple the fourth surface of the display member with a second end of the kickstand opposite the first end of the kickstand, wherein, when the computing device is to change from a first operation mode to a second operation mode, the kickstand is to move along the fourth surface of the display member via the magnetic coupling.

7. The computing device of claim 6, wherein the fourth surface is a back surface of the display member.

8. The computing device of claim 6, wherein when the computing device is to change from the first operation mode to the second operation mode, the magnetic coupling between the fourth surface of the display member and the second end of the kickstand is to overcome the bias provided by the spring, wherein the magnetic coupling is to bias the kickstand away from the second surface of the base member.

9. The computing device of claim 8, wherein when the computing device is to change from the second operation mode to a third operation mode, the spring is to overcome the magnetic coupling between the fourth surface of the display member and the second end of the kickstand, wherein the spring is to bias the kickstand back toward the second surface of the base member.

10. The computing device of claim 9, wherein the fourth surface of the display member comprises detent grooves to support the magnetic coupling between the fourth surface of the display member and the second end of the kickstand.

11. A computing device comprising:
    a base member including a top surface and a bottom surface opposite the top surface;
    a display member including a display surface and a back surface opposite the display surface, wherein the display member is rotatably connected to the base member;
    a kickstand rotatably connected to the bottom surface of the base member at a first end of the kickstand, wherein a spring is to bias the kickstand toward the bottom surface of the base member; and
    magnetic members to magnetically couple the back surface of the display member with a second end of the kickstand opposite the first end of the kickstand, wherein, when the computing device is to change from a first operation mode to a second operation mode, the magnetic coupling between the back surface of the display member and the second end of the kickstand is to overcome the bias provided by the spring.

12. The computing device of claim 11, wherein when the computing device is to change from the first operation mode to the second operation mode, the magnetic coupling is to bias the kickstand away from the bottom surface of the base member.

13. The computing device of claim 12, wherein when the computing device is to change from the second operation mode to a third operation mode, the spring is to overcome the magnetic coupling between the back surface of the display member and the second end of the kickstand, wherein the spring is to bias the kickstand back toward the bottom surface of the base member.

* * * * *